United States Patent [19]

Hartmann et al.

[11] Patent Number: 4,699,831
[45] Date of Patent: Oct. 13, 1987

[54] ELECTRICALLY INSULATING BODY

[75] Inventors: Michael J. Hartmann, Calabasas Park, Calif.; Kuang-hsin K. Lo, Houston, Tex.; Daniel A. Nolan, Corning, N.Y.

[73] Assignee: Corning Glass Works, Corning, N.Y.

[21] Appl. No.: 747,452

[22] Filed: Jun. 21, 1985

[51] Int. Cl.$^4$ ............................................. C03C 3/089
[52] U.S. Cl. .................................... 428/35; 206/328; 252/512; 252/518; 428/323; 428/328; 428/433; 501/32; 501/65
[58] Field of Search ................. 428/328, 433, 35, 323; 501/32, 65; 252/512, 518

[56] References Cited

U.S. PATENT DOCUMENTS 4,282,022  8/1981  Lo et al. .................................... 65/85

Primary Examiner—John E. Kittle
Assistant Examiner—P. R. Schwartz
Attorney, Agent, or Firm—C. S. Janes, Jr.

[57] ABSTRACT

There is disclosed a composite body that is electrically insulating, and that is composed of metal particles dispersed in a continuous glassy matrix as a second phase. The metal particles are directionally anisotropic generally paralleling a predetermined plane through the body. This permits good thermal conductivity, while retaining the electrical insulating character of the glass, thus providing improved packaging for electronic components. A method of forming the composite body is also disclosed, as are methods of creating improved electronic packaging utilizing the composite material body.

10 Claims, 11 Drawing Figures

4,699,831

ELECTRICALLY INSULATING BODY

BACKGROUND

This invention relates to a composite body that is electrically insulating and is composed of metal particles dispersed in a continuous glassy matrix to form a secondary phase. The metal particles are so shaped and oriented as to provide a unique combination of good thermal conductivity and electrical insulation.

The advantages of combining the high temperature properties of ceramics with the unique properties of metals have been apparent. Their potential has given rise to extensive studies and the development of a diverse array of materials.

There is still, however, need for a material combining good heat conductivity with the normal capability of electrical glasses and ceramics to insulate against both AC and DC currents. Recent strides in electronic component development have focused increased attention on this need. For example, light emitting diodes (LED) tend to generate substantial thermal energy during operation. If this energy is not adequately dissipated, the life of the device may be limited and/or the output power diminished.

Another component that is very susceptible to thermal damage is the integrated circuit chip in high speed digital integrated circuits. Again, operating life of the chip may be severely curtailed, unless thermal energy is dissipated as it is generated during circuit operation.

Most dielectric materials tend to be poor thermal conductors. A standard material used today for encapsulating, or packaging, electronic components is alumina, despite its recognized poor heat conductivity characteristic. Beryllia has better thermal conductivity than alumina, and has been proposed as a substitute. However, its toxic nature makes its use undesirable at best.

PURPOSES OF THE INVENTION

A basic purpose is to meet the needs heretofore described.

Another purpose is to provide a glass-metal composite having superior heat conductivity while retaining the normal electrically insulating character of the glass.

A further purpose is to provide anisotropic metal particles in a glassy matrix.

Another purpose is to provide improved packaging for electronic and optoelectronic components and integrated circuits.

Still another purpose is to provide a method of producing a glass-metal composite in which anisotropic metal particles are dispersed in a continuous glassy matrix.

SUMMARY OF THE INVENTION

Pursuant to these, and other purposes that will become apparent, the invention is an electrically insulating, glass-metal, composite body composed of discontinuous metal particles forming a secondary phase in a glassy matrix, the metal particles being directionally anisotropic generally paralleling a predetermined plane through the body to provide the electrically insulating body with a relatively high and strongly directional thermal conductivity.

In particular embodiments, the metal may be aluminum or copper, the particles may be oblate or prolate spheroids, and/or the glass may be a borosilicate having a softening point near 650° C. Also, for most effective results, the aspect ratio of the metal particles should be in excess of 5:1.

The invention further contemplates a method of making the electrically insulating body just described which comprises forming a mixture of copper powder and a pulverized borosilicate glass, heating the mixture to a temperature within about 150° C. of the glass softening temperature to produce a softened mass in which the metal exists as discontinuous particles, forming a charge of the heat softened mass into a body having a major plane, applying pressure to the formed body in such a manner as to stretch the body along a plane parallel to the major plane of the body and elongate the metal particles in that plane, and cooling the body to avoid release of the elongation effect.

The invention further contemplates an electronic component having electrically conductive members at least partially within the glass-metal composite body described above.

RELATED LITERATURE

British patent specification No. 1,479,539 (Jahn) describes a product of improved abrasion resistance and bending strength that is produced by sintering a mixture of glass and copper powders with a copper oxide, and optionally other oxide additions to improve adhesion.

U.S. Pat. No. 3,294,496 (Berghezan) discloses metal-ceramic compositions that are hard, strong, and resistant to oxidation. They may be composed of a selected metal, (e.g. copper), silica and/or germania, and alumina, and are characterized by a strong metal-ceramic bond.

U.S. Pat. No. 3,243,789 (Iler et al.) discloses copper metal having uniformly dispersed therein 0.05 to 40% by volume refractory filler particles. The material is produced by depositing copper oxide or hydroxide on refractory particles, reducing the compound to copper metal and then molding under high temperature and pressure.

U.S. Pat. Nos. 4,282,022 (Lo et al.), No. 4,304,584 (Borrelli et al.) and No. 4,479,819 (Borrelli et al.) disclose glass materials capable of polarizing light, and extrusion methods of producing such materials. The glasses characteristically contain silver or silver halide particles as a second phase which is rendered polarizing by the distorting effect of extrusion on the particles.

GENERAL DESCRIPTION OF THE INVENTION

The present invention is grounded in certain findings. Thus, it has been found that, under appropriate forming conditions, mixtures of metal and glass powders can be thermally softened to form a composite of metal particles dispersed as a discontinuous phase in a continuous glassy matrix. Further, the composite may be subjected to pressure conditions which distort the shape of the metal particles and impart unique properties.

The particular conditions required for any given glass-metal combination may be determined from property data and experience. However, certain general guidelines can be established on the basis that a metal-glass bond must be formed and maintained, and the glass must be softened to render it formable.

This dictates that the forming temperature must be near the glass softening point. If the temperature is significantly above the softening point, e.g. up to 150° C. above, the metal will tend to enter the glass matrix in ionic form. Likewise, temperatures substantially below the glass softening temperature may be too low for a glass-metal bond to form.

At the same time, the metal must have a melting temperature above the forming temperature so that the metal particle itself is not rendered molten. On the other hand, as indicated, the metal must bond with the glass. Thus, incipient reaction appears necessary, but it must not proceed further or the separate phase is lost.

Copper and aluminum powders are generally preferred. The former is especially desirable because of its high thermal conductivity and high melting point. The metal and glass are both powdered, preferably to finely comminuted form with an average particle size of 10–100 microns, and thoroughly mixed before being thermally softened.

Various glasses may be used within the conditions indicated. Thus, borosilicates may be used in some cases, for example with aluminum powder. However, alumina-containing glasses generally have higher softening points and are preferred for other metals, in particular copper.

The mixture of powdered glass and metal may be thermally softened in a pressure chamber for subsequent treatment, or may be softened separately. In either case, a charge of the softened mix is molded and exposed to certain pressure conditions. The mix may be so molded as to provide a shape with a major surface and thin cross section, e.g., a ribbon or sheet. Before cooling, and preferably during molding, the body is exposed to pressure of such nature as to elongate, and thus render anisotropic, the metal particles. The particles are elongated in a directionally oriented manner paralleling a predetermined plane through the molded body, the plane being determined by the vector of the force or forces applied.

The directional orientation imparted to the metal particles in a particular body depends on the desired directional orientation of thermal conductivity. Thus, if unidirectional conductivity normal to the face of a sheet or plate is desired, forces will be applied to elongate the particles normal to that face. The particles will have a prolate form paralleling a plane normal to the surface. Conversely, if two-directional, lateral heat conductivity is desired, as is the more usual case, force will be applied to elongate the metal particles in oblate form parallel to the face and main plane of the plate.

The two directional orientations just described are shown schematically in perspective in FIGS. 1 and 2 of the drawing. Each FIGURE shows a glass plate 10,10' having metal particles 12,12' dispersed therein and elongated in accordance with the present inventive method. The particles 12 in FIG. 1 are unidirectional, i.e. in prolate form, with the major axis normal to face 14 of plate 10. This favors thermal conductivity through the plate as shown by the arrow. The particles 12' in FIG. 2 are of oblate form with the major axis parallel to face 14' of plate 10'. This favors lateral thermal conductivity parallel to the face as shown by the arrows.

The pressure-developed elongation of the metal particles within the glassy matrix can be accomplished by rolling, stretching, hot pressing, or extrusion. We prefer one of the latter two usually. In accordance with the disclosure in U.S. Pat. No. 4,282,022, glass may be extruded at temperatures such that the viscosity ranges between $10^6$ and $10^{11}$ poises. This corresponds to temperatures between the annealing and softening temperatures of the glass.

In the case of silver halide particles in polarized glasses, there is a tendency for the metal particles to reassume their original shape. The present composite bodies are characterized by considerably larger metal particle size, whereby there is much less tendency to reform. Accordingly, the glass-metal composite may usually be cooled at a normal cooling rate to freeze in the new configurations.

DESCRIPTION OF THE PREFERRED EMBODIMENTS

The following table reports several glass compositions, expressed in parts by weight on an oxide basis, which have been used in practicing the invention. The sum of the individual components approximates 100 in each case. Hence, the recorded values may be taken as weight percent for many purposes. Because it is not known with which cation(s) the fluoride is combined, it is merely recorded as fluoride in accordance with conventional glass analysis practice.

The actual batch ingredients may comprise any materials, either oxides, or other compounds which, when melted with the other batch materials, will be converted to the desired oxide in the proper proportions.

In preparing glasses for use, the batch constituents were mingled, ball milled to improve homogeneity of the melt, and then charged into platinum crucibles. After covering with lids, the crucibles were introduced into a furnace operating at about 1500° C., held at such temperature for four (4) hours, and the melts then poured into steel molds to form slabs $6'' \times 6'' \times \frac{1}{2}''$. The slabs were then transferred to an annealer operating at about 450° C.

TABLE I

|  | 1 | 2 | 3 | 4 | 5 | 6 | 7 |
|---|---|---|---|---|---|---|---|
| $SiO_2$ | 69 | 51.8 | 36.7 | 40 | 70 | 48 | 12.5 |
| $Al_2O_3$ | 4 | 7.8 | — | — | 3 | 7 | — |
| $B_2O_3$ | 25 | 31.0 | 42.5 | 34 | 26 | 34 | 22.5 |
| BaO | — | — | 20.8 | 21 | — | — | — |
| MgO | — | — | — | — | — | — | 2.5 |
| ZnO | — | — | — | — | — | — | 62.5 |
| $Na_2O$ | — | 9.2 | — | 5 | 2 | 11 | — |
| $K_2O$ | 0.2 | — | — | — | — | — | — |
| $Li_2O$ | 1.5 | — | — | — | — | — | — |
| F | — | 1.2 | — | — | — | 2.6 | — |

Physical measurements were made on glass samples, and are recorded in TABLE II below. The average thermal coefficient of expansion between room temperature and 300° C. is shown as "Exp. ($\times 10^{-7}/°C.$)"; glass softening point as "SOFT. °C."; glass annealing temperature is "ANN. °C."; strain point as "STR. °C.".

TABLE II

| Glass | Exp.($\times 10^{-7}/°C.$) | Soft.°C. | Ann.°C. | Str.°C. |
|---|---|---|---|---|
| 1 | 32 | 708 | 514 | 455 |
| 2 | 64 | 650 | 442 | 400 |
| 3 | 52 | 650 | 554 | 517 |
| 4 | — | 675 | — | — |
| 5 | — | 650 | 505 | 450 |
| 6 | — | 650 | 437 | 401 |
| 7 | 40 | 644 | 510 | 456 |

Samples of several glasses were comminuted and intimately mixed with copper metal powder in various proportions. Average particle size for both glass and copper was generally in the range of 10–100 microns. The mixtures thus obtained were heated at about 700°

C. for three (3) hours and extruded in the form of a narrow band under pressure of about 3,000 psi.

The compositions of the mixtures are shown in terms of weight percent in TABLE III, the glass percent being the remainder. Also shown are strength measurements in terms of modulus of rupture (M.O.R.) measured in psi. These measurements were bending measurements made in conventional manner on bars supported on knife edges.

TABLE III

| Copper % | Glass | M.O.R. (psi) |
| --- | --- | --- |
| 40 | 2 | 14,200 |
| 40 | 7 | 18,200 |
| 40 | 5 | 12,500 |
| 22 | 5 | 8,600 |
| 22 | 7 | 8,800 |
| 22 | 2 | 8,800 |

DESCRIPTION OF THE DRAWINGS

The invention is further illustrated with reference to the accompanying drawing wherein.

FIG. 3 shows a half of an encapsulation package for a LED. The ultimate package is a solid cylindrical member that fits around leads as shown in FIG. 4. However, a package in accordance with the present invention is formed in two halves which are subsequently joined.

As shown in FIG. 3, "half" package 20 is a semi-cylindrical body which may be approximately ¼"in diameter and ¼"in heighth in a typical size. Half-package 20 is formed with, or has machined, channels 22 within which electrical leads are held.

FIGS. 4(a) and 4(b) show an LED 24 with leads 26 extending therefrom. Two half-packages 20, formed from the present materials and by the present method, are mounted in opposed position, brought together about leads 26, and sealed. Depending on requirements, any sealant may be used. Where hermetic sealing is desired, a soft sealing coating or glaze on the sealing surfaces may be employed.

In some instances, the need for heat dissipation may be sufficient to still require a heat sink. In such a case, the substrate shown in FIG. 1 may be modified as illustrated in FIGS. 5-7.

Figure 5:
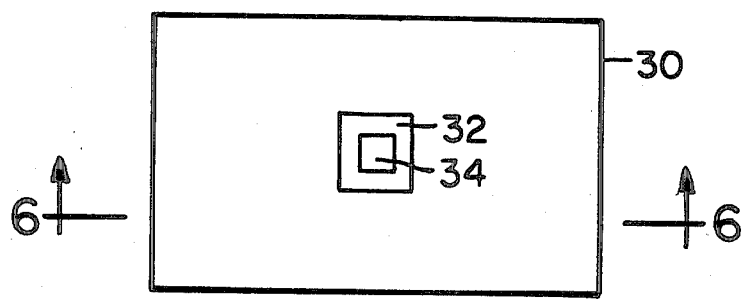
FIG. 5 is a top plan view of a composite body in accordance with the invention.

FIG. 5 is a top plan view of a sheet-like substrate 30, formed from a glass-metal composite material in accordance with the invention. Substrate 30 has a central indented cavity 32 within which an integrated circuit 34, shown schematically, may be mounted and sealed.

Figure 1:
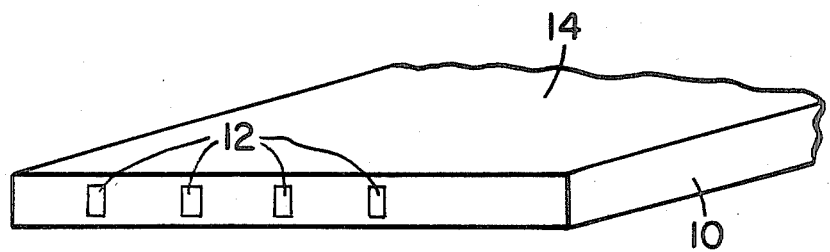
FIGS. 1 and 2 are schematic views, in perspective, of composite bodies in accordance with the invention.
Figure 2:
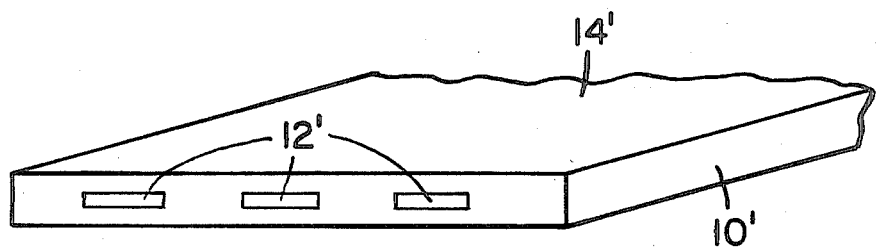
Figure 4A:
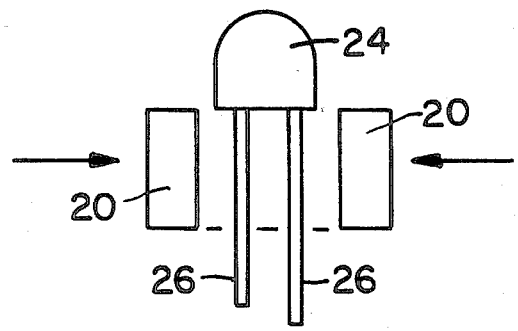
FIGS. 4(a) and 4(b) are exploded and closed side views, respectively, of a packaged diode.
Figure 3:
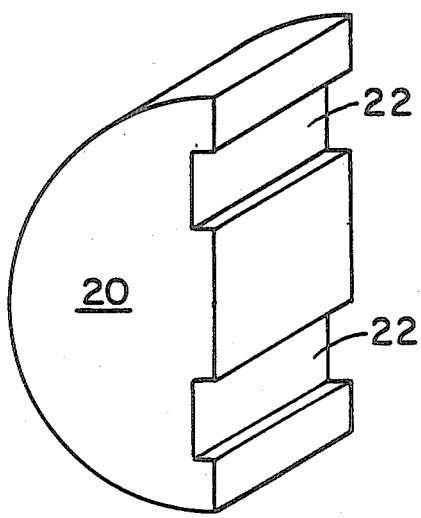
FIG. 3 is a perspective view of a typical half-package for a light emitting diode.
Figure 4B:
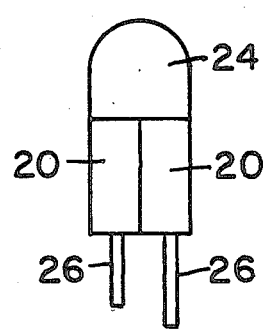
Figure 6:
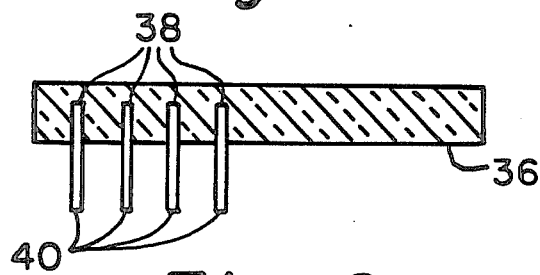
FIG. 6 is a cross-section view taken along line 6—6 of FIG. 5.

FIG. 6 is a cross-section of substrate 30 taken along line 6—6. Substrate 30 is formed from a plate, as shown in FIG. 1, with vertical metal particle orientation. This plate has one surface 36 abraded, or otherwise treated, to remove a surface layer and expose metal particles 38. These particles then may have attached thereto metal pins 40 to function as a heat sink or heat radiator. Alternatively, a plate or foil of metal might be attached, depending on the degree of heat dissipation required.

Figure 7:
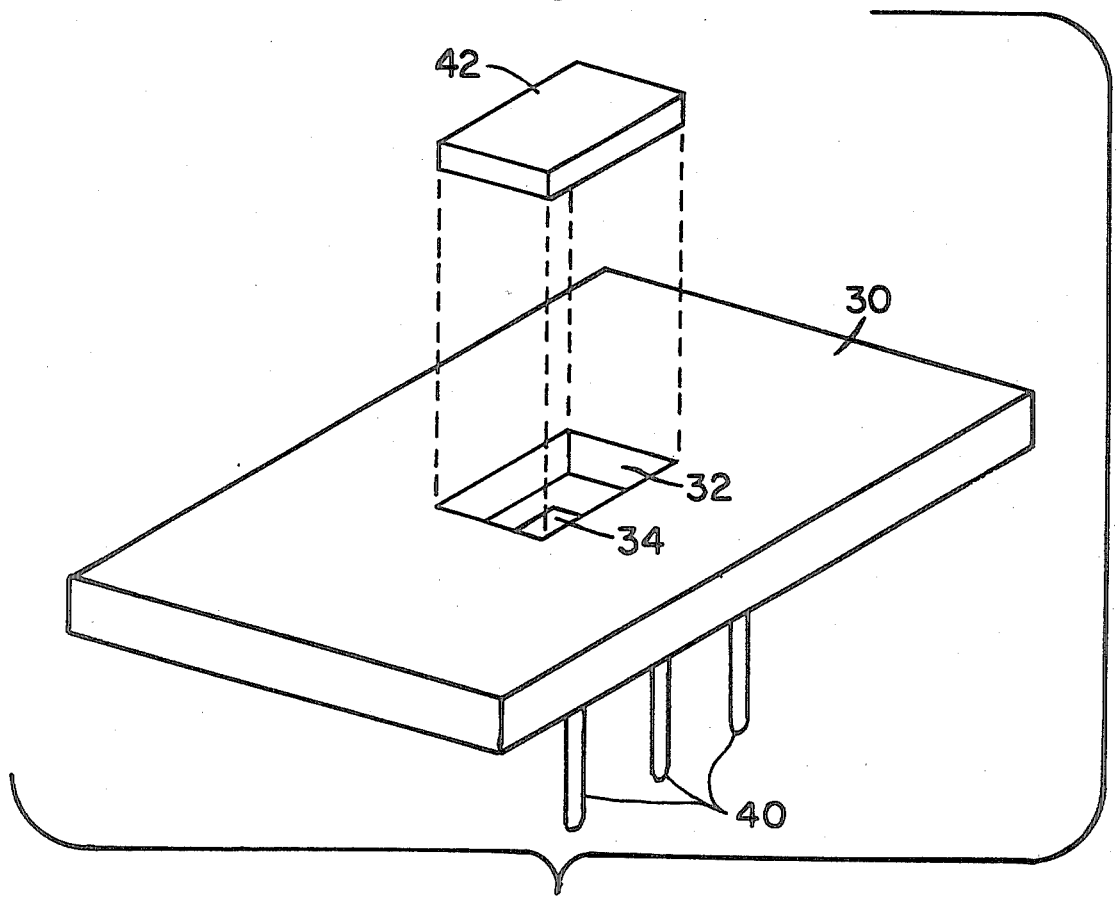
FIG. 7 is a perspective view of an integrated circuit package embodying a composite body in accordance with the invention.

FIG. 7 shows, in perspective, the integrated circuit package. A metal lid 42 may form the closure, but may be replaced with a plate similar to that used as substrate 30. The exposed metal particles may be sealed to the glass surface by metallizing.

One familiar with electronic and optoelectronic equipment will readily perceive the many ways in which the present inventive material may be applied in these arts.

A comparison of thermal conductivity values demonstrates the improvement available in electronic packaging produced in accordance with the invention. For example, a finely divided glass having the composition of Example 2 and aluminum powder were intimately mixed in equal parts by weight, and the mixture charged into a hot press operating at about 640° C. Pressure of about 3,000 psi was applied while the material was held at essentially constant temperature. The pressed body was removed and rapidly cooled.

TABLE IV sets forth thermal conductivity values, in watts/meter°C., (W/M°C.) for the subject pressed mixture and three well-known materials.

TABLE IV

| Alumina | 30 |
| --- | --- |
| Beryllia | 110 |
| Glass-Aluminum | 60 |
| Copper | 300 |

Based on the measured value of the glass-aluminum composite, it was calculated that a corresponding glass-copper composite would provide a value of about 106, comparable to Beryllia.

Figure 8:
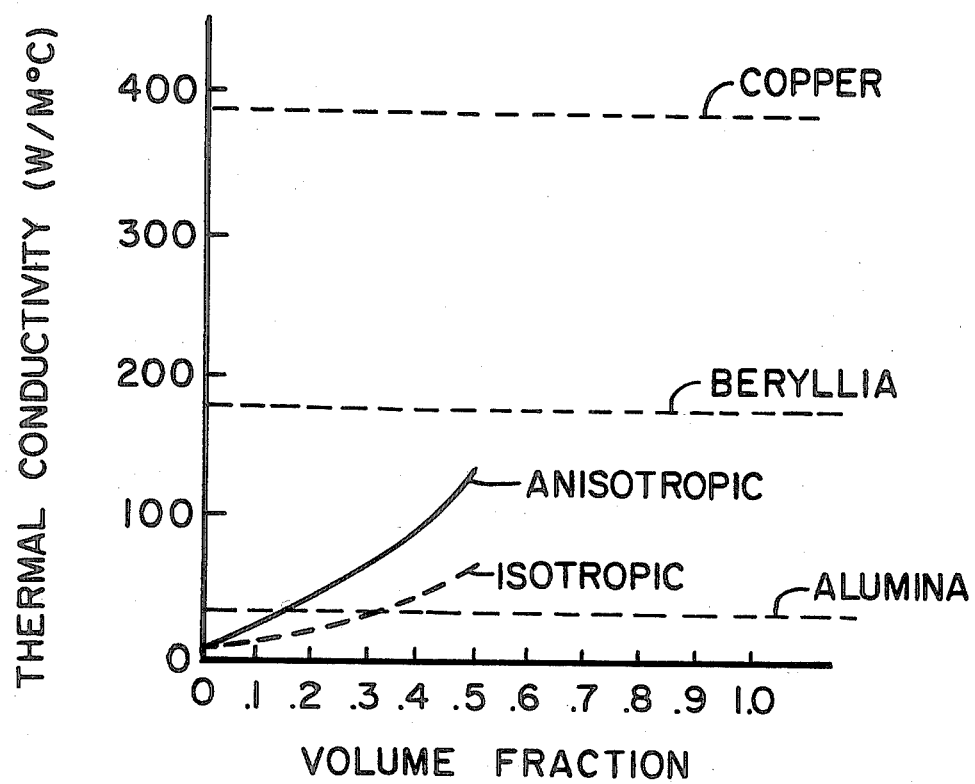
FIGS. 8, 9 and 10 are graphical illustrations of the manner in which certain properties vary with changing volume fractions of metal and glass in the present bodies.
Figure 9:
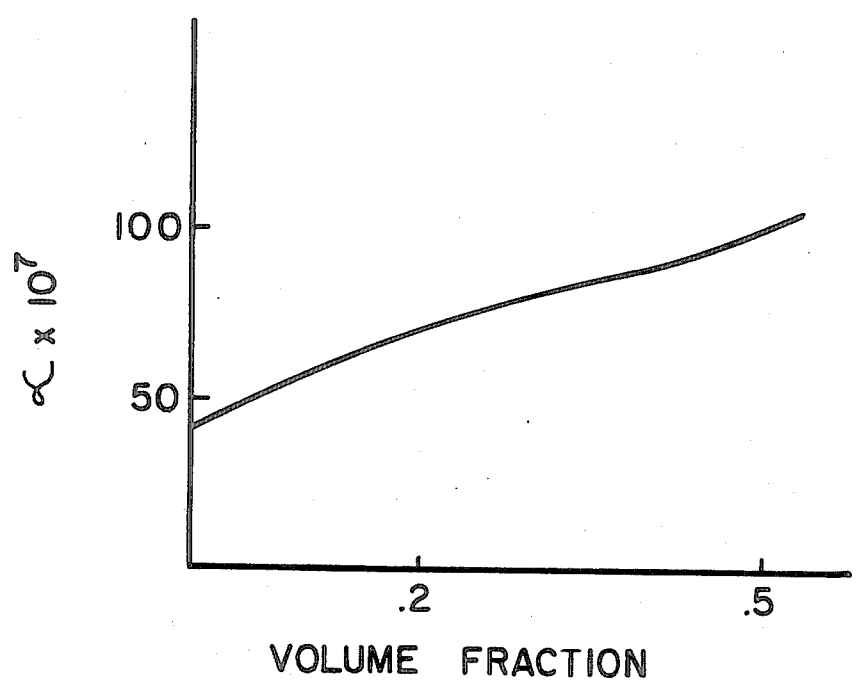
Figure 10:
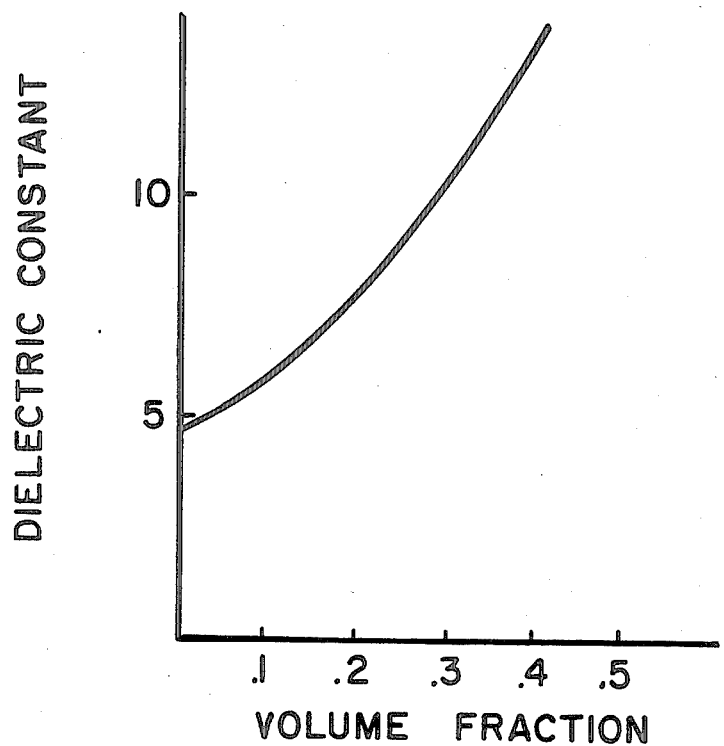

The graphical illustrations in FIGS. 8, 9 and 10 show thermal conductivity (FIG. 8), thermal coefficient of expansion $\times 10^{-7}$ (FIG. 9) and dielectric constant (FIG. 10) values of composite materials as a function of copper volume fraction in mixtures of copper with a glass such as Example 1. In each case, property values are plotted along the vertical axis and copper volume fraction along the horizontal.

Thermal conductivity in FIG. 8 is in terms of watts/meter°C. The values for an anisotropic composite, in accordance with the invention, are shown in solid line. The lower dashed line shows corresponding values for an isotropic composite. Absolute values for copper, beryllia and alumina are also shown.

Actual thermal coefficient of expansion values are multiplied by $10^7$ to facilitate graphical comparison and are in Al/1°C. Dielectric constant values are unitless, being the ratio compared to the value for a vacuum.

By way of further illustrating preparation of composites, a mixture of 40 parts by weight glass and 60 parts by weight copper was prepared. The glass had the following composition in parts by weight: 69.7 $SiO_2$, 1.9 $Al_2O_3$, 26.4 $B_2O_3$, 0.4 $K_2O$ and 1.4 $Li_2O$.

The glass was ballmilled to a particle size in the 10–100 micron range and mixed with copper powder available from Fisher Scientific under code C-431. The mixture was placed in a hard glass form and extruded through a ⅛″×1 ¼″ slot at a temperature of 770° C. and under a pressure of about 10,000 psi.

250 grams of glass were intimately mixed with 1000grams of C-431 copper powder and charged into an extrusion chamber operating at 746° C. The mix was extruded by applying a force of 25-50 tons. The glass composition in parts by weight was: 71 $SiO_2$, 26.9 $B_2O_3$, 0.4 KF, and 1.5 $Li_2O$.

We claim:

1. An electrically insulating, composite body which exhibits a relatively high and strongly directional thermal conductivity in a predetermined plane through the body composed of discontinuous metal particles forming a secondary phase in a glassy matrix, the metal particles being directionally anisotropic generally paralleling said predetermined plane through the body and having an average particle size of at least about 10 microns prior to elongation.

2. A composite body in accordance with claim 1 wherein the metal is copper.

3. A composite body in accordance with claim 1 wherein the metal particles are distorted spheroids.

4. A composite body in accordance with claim 1 wherein the aspect ratio of the metal particles is at least 5:1.

5. A composite body in accordance with claim 1 wherein the matrix glass is a borosilicate with a softening point near 650° C.

6. A composite body in accordance with claim 1 wherein the metal particles are aluminum and the matrix glass is a borosilicate glass.

7. A composite body in accordance with claim 1 wherein the metal particles have an average particle size in the range of 10-100 microns.

8. A package for electrically conducting members selected from the group consisting of electronic components, optoelectronic components, and integrated circuits which exhibits a relatively high and strongly directional thermal conductivity in a predetermined plane, said package consisting of an electrically insulating, composite body composed of discontinuous metal particles forming a secondary phase in a glassy matrix, the metal particles being directionally anisotropic generally paralleling said predetermined plane and having an average particle size of at least about 10 microns prior to elongation.

9. A package in accordance with claim 8 having at least one metal member attached to an external surface as a heat sink.

10. A package in accordance with claim 8 wherein the metal particles have an average particle size in the range of 10-100 microns.

* * * * *